United States Patent [19]
Matsuki

[11] Patent Number: 6,021,062
[45] Date of Patent: Feb. 1, 2000

[54] SEMICONDUCTOR MEMORY DEVICE CAPABLE OF REDUCING A LOAD IMPOSED UPON A SENSE AMPLIFIER TO SHORTEN A SENSING TIME

[75] Inventor: Syouzi Matsuki, Tokyo, Japan

[73] Assignee: NEC Corporation, Tokyo, Japan

[21] Appl. No.: 09/315,150

[22] Filed: May 20, 1999

[30] Foreign Application Priority Data

May 20, 1998 [JP] Japan .................................. 10-138899

[51] Int. Cl.[7] .................................................... G11C 5/06
[52] U.S. Cl. ........................ 365/63; 365/51; 365/230.03; 365/189.06; 365/189.01
[58] Field of Search .......................... 365/63, 51, 230.03, 365/189.06, 189.01

[56] References Cited

U.S. PATENT DOCUMENTS 5,912,857  6/1999  Kim et al. ........................... 365/230.06

Primary Examiner—Andrew Q. Tran
Attorney, Agent, or Firm—McGinn & Gibb, P.C.

[57] ABSTRACT

A semiconductor memory device comprises a plurality of banks (B1–Bn), a plurality of local buses (L0T and L0N–LnT and LnN) arranged in the banks, and a global bus (G) connected to the local buses. A switching element (TR05 and TR06–TRn5 and TRn6) is arranged at a junction between each of the local buses and the global bus. The switching element comprises a transistor. The transistor is responsive to a signal supplied from the local bus to its gate. The transistor connects the local bus and the global bus.

7 Claims, 5 Drawing Sheets

SEMICONDUCTOR MEMORY DEVICE CAPABLE OF REDUCING A LOAD IMPOSED UPON A SENSE AMPLIFIER TO SHORTEN A SENSING TIME

BACKGROUND OF THE INVENTION

This invention relates to a semiconductor memory device having a multibank memory structure adapted to an increase in memory capacity.

Following an increase in memory capacity, use has recently been made of a semiconductor memory device having a multibank memory structure.

Referring to FIG. 1, an existing semiconductor memory device of the type comprises a plurality of banks B0, B1, . . . , and Bn. In order to reduce a circuit area, an input/output bus connected to an input/output block is often divided into a plurality of local buses L0, L1, . . . , and Ln arranged in the banks B0, B1, . . . , and Bn, respectively, and a global bus G connected to the local buses L0, L1, . . . , and Ln.

Referring to FIG. 2, each of the banks B0 through Bn includes a plurality of memory cells. In the bank B0, the memory cells C00, C01, . . . , and C0n are arranged at junctions between a plurality of word lines WL00, WL1, . . . , and WL0n and a pair of digit lines D0 and DB0. In the bank B1, the memory cells C10, C11, . . . , and C1n are arranged at junctions between a plurality of word lines WL10, WL11, . . . , and WL1n and a pair of digit lines D1 and DB1. The bank B0 further includes a sense amplifier SA0 and a pair of read/write control transistors TR01 and TR02 connected to output sides of the digit lines D0 and DB0. The bank B1 further includes a sense amplifier SA1 and a pair of read/write control transistors TR11 and TR12 connected to output sides of the digit lines D1 and DB1. Although not illustrated in the figure, each of the remaining banks has a similar structure.

The existing semiconductor memory device further comprises a plurality of transfer gates TRF1, TRF2, . . . , and TRFn arranged at junctions between the local buses L0, L1, . . . , and Ln and the global bus G.

In the existing semiconductor memory device described above, the local buses L0, L1, . . . , and Ln and the global bus G are connected through the transfer gates TRF1, TRF2, . . . , and TRFn, respectively. With this structure, a capacitance of the global bus G is included in a load upon each of the sense amplifiers SA0, SA1, . . . , and SAn during a reading operation of the memory cells. Thus, when each of the sense amplifiers SA0, SA1 . . . , and SAn is driven, the load including the capacitance of the global bus is inevitably imposed. It is therefore difficult to shorten a sensing time.

SUMMARY OF THE INVENTION

It is an object of this invention to provide a semiconductor memory device capable of reducing a load imposed upon a sense amplifier to shorten a sensing time.

According to this invention, there is provided a semiconductor memory device comprising a plurality of banks, a plurality of local buses arranged in the banks, and a global bus connected to the local buses, and a switching element arranged at a junction between each of the local buses and the global bus. The switching element comprises a transistor. The transistor is responsive to a signal supplied from the local bus to its gate. The transistor connects the local bus and the global bus.

The global bus is provided with a clamp element for holding the global bus at a high level.

The local bus is provided with a clamp element for holding the local bus at a high level.

The global bus is divided into a read global bus and a write global bus.

The read global bus is provided with a clamp element for holding the read global bus at a high level.

The write global bus is provided with a switching element for transmitting write data on the write global bus to the local bus upon writing.

DESCRIPTION OF PREFERRED EMBODIMENTS

Figure 1:
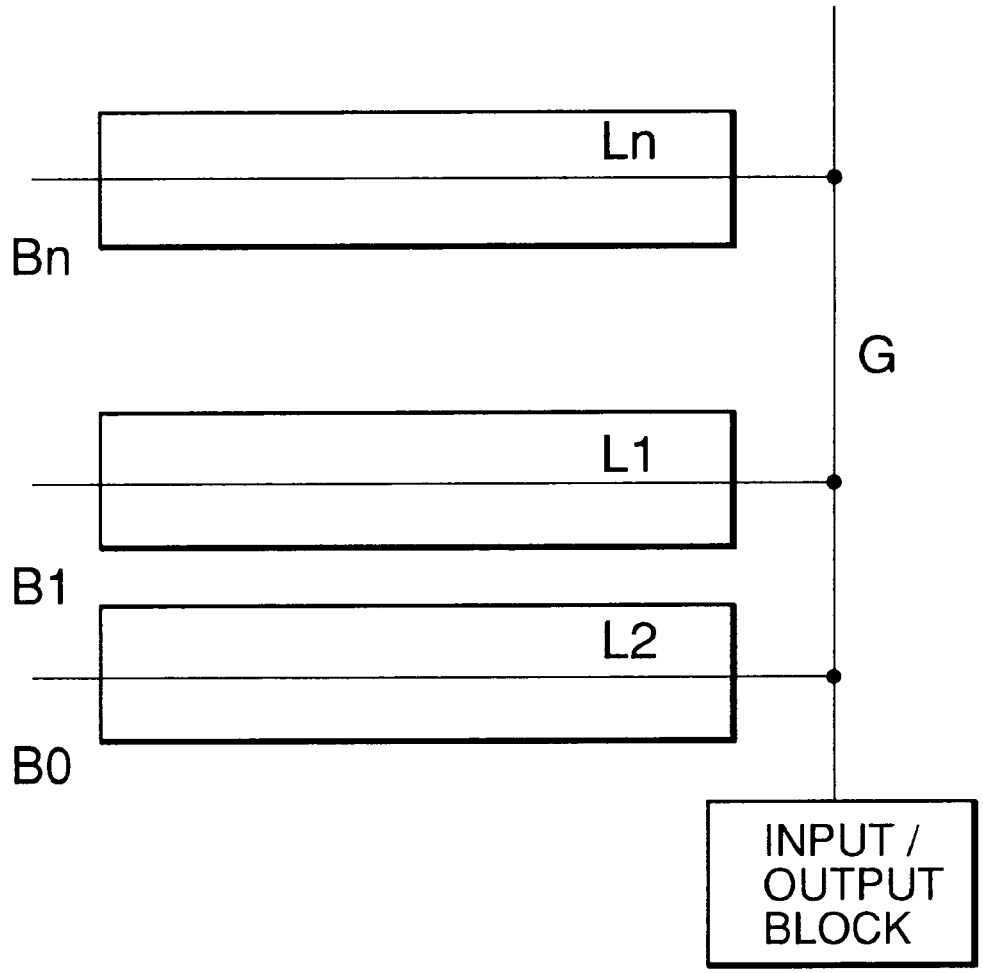
FIG. 1 is a view showing an existing semiconductor memory device of a multibank structure.
Figure 2:
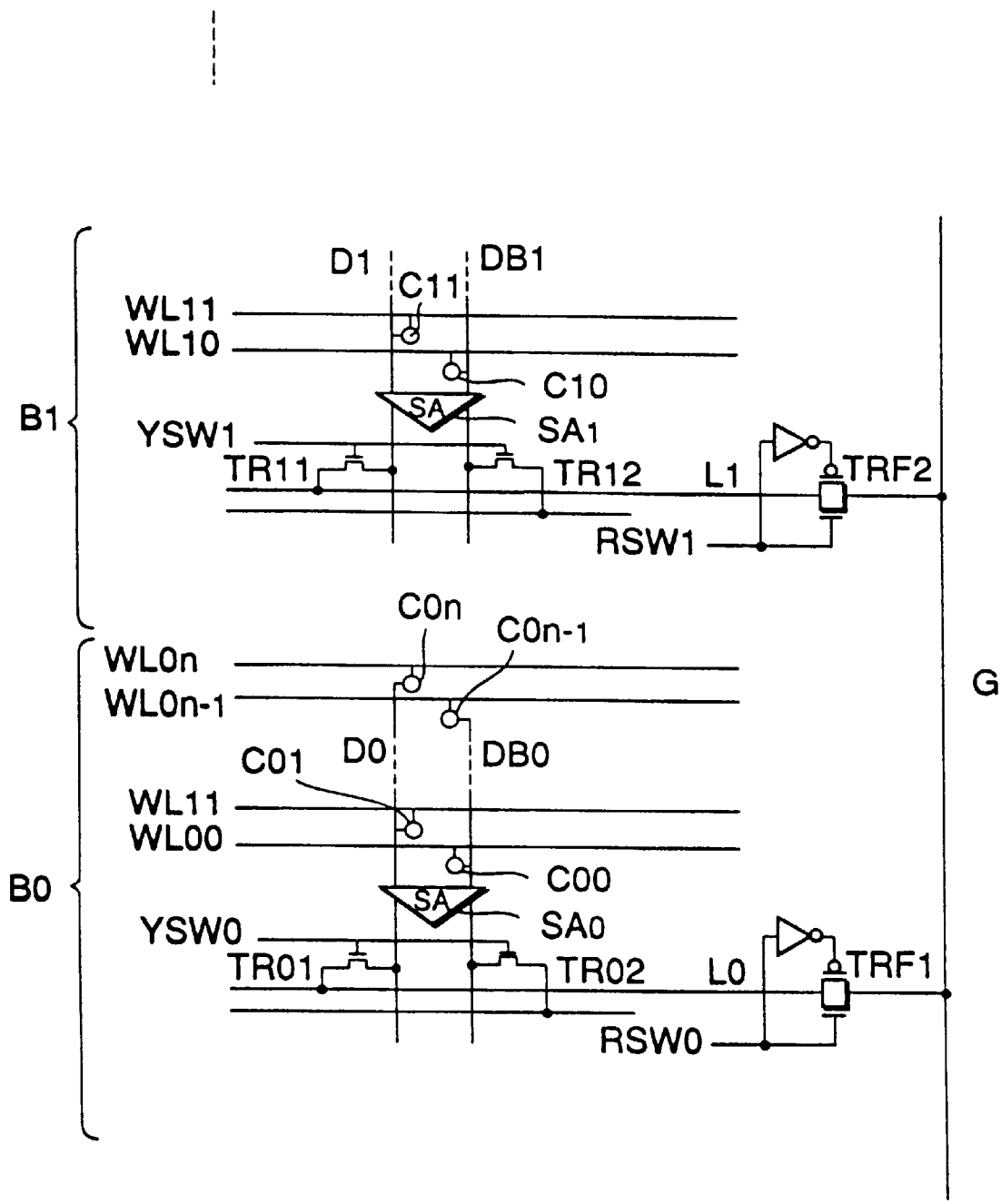
FIG. 2 is a circuit diagram showing banks in FIG. 1 in detail.

Now, description will be made about embodiments of this invention with reference to the drawing.

At first referring to FIG. 1, a semiconductor memory device according to a first embodiment of this invention comprises a plurality of banks B0, B1, . . . , and Bn connected to an input/output bus. In order to reduce a circuit area, the input/output bus is divided into a plurality of pairs of local buses L0T and L0N, L1T and L1N, . . . , LnT and LnN arranged in the banks B0, B1, . . . , and Bn, respectively, and a global bus G connected to the local buses L0T and L0N, L1T and L1N, . . . , and LnT and LnN.

Each of the banks B0, B1, . . . , and Bn includes a plurality of memory cells. In the bank B0, the memory cells C00, C01, . . . , and C0n are arranged at junctions between a plurality of word lines WL00, WL01, . . . , and WL0n and a pair of digit lines D0 and DB0. In the bank B1, the memory cells C10, C11, . . . , and C1n are arranged at junctions between a plurality of word lines WL10, WL11, . . . , and WL1n and a pair of digit lines D1 and DB1. The bank B0 further includes a sense amplifier SA0 and a pair of read/write control transistors TR01 and TR02 connected to output sides of the digit lines D0 and DB0. The bank B1 further includes a sense amplifier SA1 and a pair of read/write control transistors TR11 and TR12 connected to output sides of the digit lines D1 and DB1. Although not illustrated in the figure, each of the remaining banks has a similar structure.

In the bank B0, the cells C00 C01, . . . , and C0n are connected to the digit lines D0 and DB0 when the word lines WL00, WL01, . . . , and WL0n have a signal level of a high level. The sense amplifier SA0 serves to amplify data on the digit lines D0 and DB0. In the bank B1, the cells C10, C11, . . . , and C1n are connected to the digit lines D1 and DB1 when the word lines WL10, WL11, . . . , and WL1n have a signal level of a high level. The sense amplifier SA1 serves to amplify data on the digit lines D1 and DB1.

The transistors TR01 and TR02 in the bank B0 have sources connected to the digit lines D0 and DB0, respectively, drains connected to the local buses L0T and L0N, respectively, and gates supplied with a signal YSW0. Upon reading (when the signal YSW0 has a high level), the data on the digit lines D0 and DB0 are transmitted to the local buses L0T and L0N, respectively. The transistors TR11 and TR12 in the bank B1 have sources connected to the digit lines D1 and DB1, respectively, drains connected to the local buses L1T and L1N, respectively, and gates supplied with a signal YSW1. Upon reading (when the signal YSW1 has a high level), the data on the digit lines D1 and DB1 are transmitted to the local buses L1T and L1N, respectively.

The semiconductor memory device further comprises a plurality of pairs of transistors TR05 and TR06, TR15 and TR16, . . . , and TRn5 and TRn6 as switching elements arranged at junctions between the global bus G and the local buses L0T and L0N, L1T and L1N, . . . , and LnT and LnN, respectively.

The transistors TR05 and TR06 are connected in cascade. Likewise, the transistors TR15 and TR16 are connected in cascade. The transistors TR06 and TR16 have sources connected to the ground. The transistors TR05 and TR15 have drains connected to the global bus G.

The transistor TR05 is operated in response to a signal supplied from the local bus L0T to its gate. The transistor TR06 is operated in response to a signal RSW0 supplied to its gate.

The transistor TR15 is operated in response to a signal from the local bus L1T supplied to its gate. The transistor TR16 is operated in response to a signal RSW1 supplied to its gate.

The global bus G is connected to a transistor TRC as a clamp element for holding the global bus G at a high level. The local buses L0T and L0N in the bank B0 are connected to transistors TR03 and TR04 as clamp transistors for holding the local buses L0T and L0N at a high level, respectively. The local buses L1T and LiN in the bank B1 are connected to transistors TR13 and TR14 as clamp transistors for holding the local buses L1T and L1N at a high level, respectively.

Figure 3:
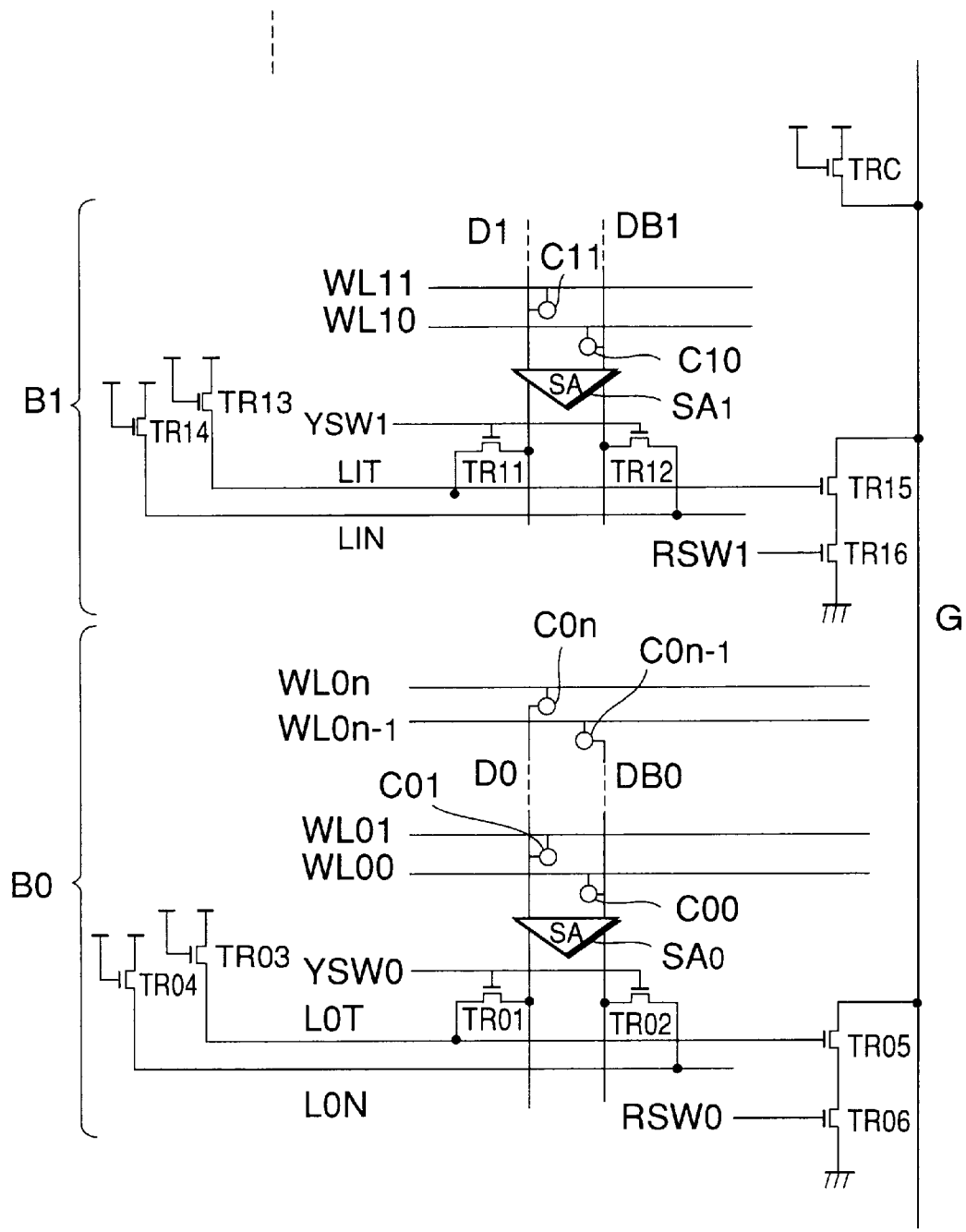
FIG. 3 is a circuit diagram showing a semiconductor memory device according to a first embodiment of this invention.
Figure 4:
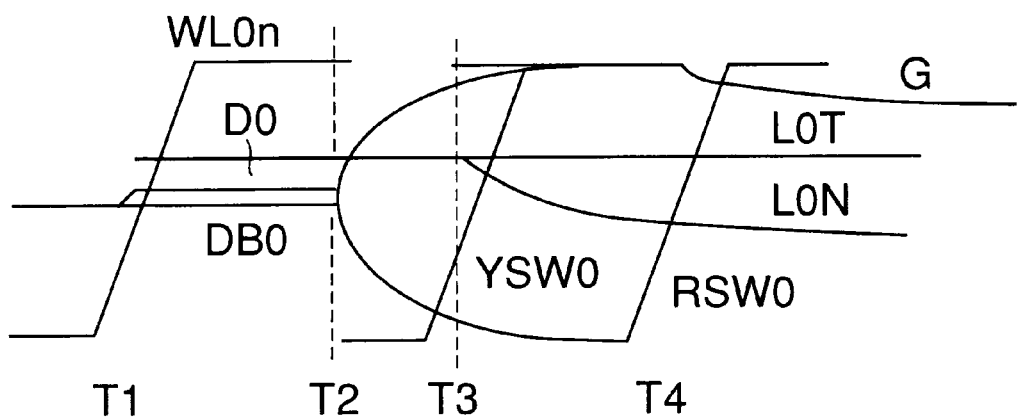
FIG. 4 is a timing chart for describing an operation of the semiconductor memory device in FIG. 3.

Referring to FIG. 4 in addition to FIG. 3, an operation of the semiconductor memory device according to the first embodiment of this invention will be described. In the following, description will be made about the bank B0 by way of example. The similar operation is carried out in each of the remaining banks.

It is assumed here that the cells C00, C01, . . . , and C0n hold high-level data.

Time Period T1 in FIG. 4:

Each of the word lines WL01 through WL0n in the bank B0 has a signal level of a high level. Each of the cells C00, C1, . . . , and C0n is connected to the digit line D0 or DB0 so that the high-level data in each of the cells C00, C01, . . . , and C0n are supplied to the digit line D0 or DB0.

Time Period T2 in FIG. 4:

The sense amplifier SA0 amplifies the data supplied from the cells C00, C01, . . . , and C0n to the digit lines D0 and DB0.

Time Period T3 in FIG. 4:

When the signal YSW0 has a high level, the transistors TR01 and TR02 are turned on. The data supplied from the cells C00, C01, . . . , and C0n to the digit lines D0 and DB0 and amplified by the sense amplifier SA0 are transmitted from the digit lines D0 and DB0 to the local buses L0T and L0N, respectively.

Time Period T4 in FIG. 4:

The signal RSW0 is given a high level and the transistor TR06 is turned on. Since the data thus transmitted to the local bus L0T have a high level, the transistor TR05 is turned on. Therefore, the global bus G is given a low level.

On the contrary, it is assumed that the data transmitted to the local bus L0T have a low level. In this event, the transistor TR05 is turned off so that the global bus G holds a high level clamped by the transistor TRC.

Thus, when the transistor TR05 is turned on in response to the signal supplied to its gate, the local bus L0T is connected to the global bus G. Therefore, the local bus and the global bus are inverted in data logic.

Specifically, when the data on the local bus L0T has a high level, the data on the global bus G has a low level. When the data on the local bus L0T has a low level, the data on the global bus G has a high level.

In the first embodiment described above, when the transistors TR05 and TR06 are operated in response to the signals supplied to their gates, the local bus L0T is connected to the global bus G. Therefore, upon reading, a capacitance of the global bus G is separated from a load upon the sense amplifier SA0. It is thus possible to reduce the capacitance upon driving the sense amplifier SA0 so that a sensing time is shortened.

Figure 5:
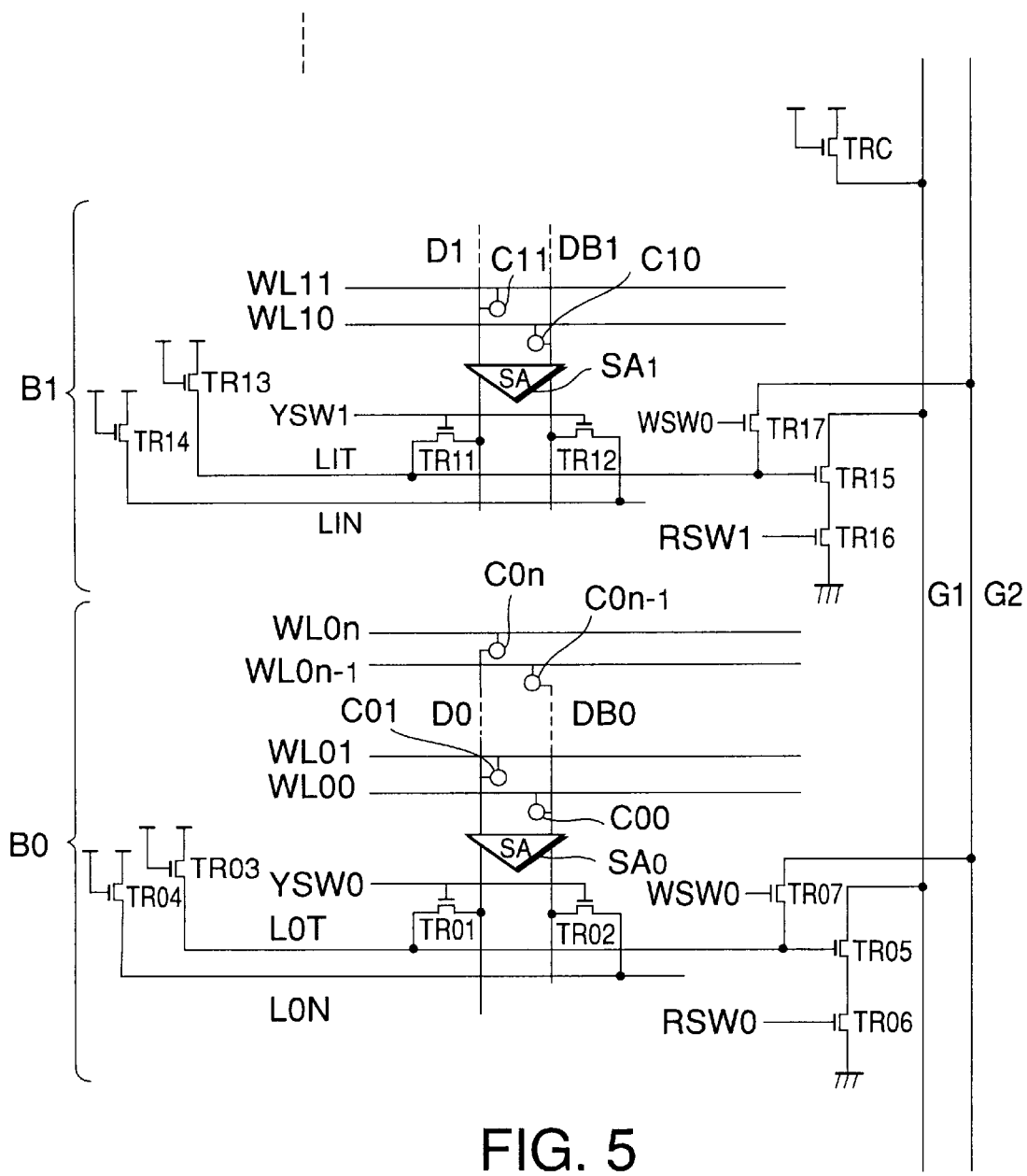
FIG. 5 is a circuit diagram showing a semiconductor memory device according to a second embodiment of this invention.

Referring to FIG. 5, a semiconductor memory device according to a second embodiment of this invention is similar in structure to the first embodiment except that the global bus G is divided into a read global bus G1 and a write global bus G2. In addition, a transistor TR07 is connected to the write global bus G2.

The transistor TR05 in the bank B0 receives at its gate the signal from the local bus L0T with its drain connected to the read global bus G1. The transistor TR06 receives at its gate the signal RSW0 with its source connected to GND (ground) and its drain connected to a source of the transistor TR05.

The transistor TRC serves as a clamp element for holding the read global bus G1 at a high level. The transistors TR03 and TR04 serve as the clamp elements for holding the local buses L0T and L0N at a high level, respectively.

When the word lines WL00, WL01, . . . , and WL0n are given a high level, the cells C00, C01, . . . , and C0n are connected to the digit lines D0 and DB0.

The sense amplifier SA0 amplifies the data on the digit lines D0 and DB0.

The transistors TR01 and TR02 have the gates supplied with the signal YSW0, the sources connected to the digit lines D0 and DB0, respectively, and the drains connected to the local buses L0T and L0N, respectively. Upon reading (when the signal YSW0 has a high level), the data on the digit lines D0 and DB0 are transmitted to the local buses L0T and L0N, respectively.

The transistor TR07 has a gate supplied with a signal WSW0, a source connected to the write global bus G2, and a drain connected to the local bus L0T. Upon writing (when the signal WSW0 has a high level), write data on the write global bus G2 are transmitted to the local bus L0T.

Next referring to the timing chart in FIG. 4, an operation of the semiconductor memory device according to the second embodiment of this invention will be described in conjunction with a reading operation. In the following, description will be made about the bank B0 by way of example. The similar operation is carried out in each of the remaining banks.

It is assumed here that the cells C00, C01, . . . , and C0n hold the high-level data.

Time Period T1 in FIG. 4:

Each of the word lines WL01 through WL0n in the bank B0 has a signal level of a high level. Each of the cells C00, C01, . . . , and C0n is connected to the digit line D0 or DB0 so that the high-level data in each of the cells C00, C01, . . . , and C0n are supplied to the digit line D0 or DB0.

Time Period T2 in FIG. 4:

The sense amplifier SA0 amplifies the data supplied from the cells C00, C01, . . . , and C0n to the digit lines D0 and DB0.

Time Period T3 in FIG. 4:

When the signal YSW0 has a high level, the transistors TR01 and TR02 are turned on. The data supplied from the cells C00, C01, . . . , and C0n to the digit lines D0 and DB0 and amplified by the sense amplifier SA0 are transmitted from the digit lines D0 to the local bus L0T.

Time Period T4 in FIG. 4:

The signal RSW0 is given a high level and the transistor TR06 is turned on. Since the data thus transmitted to the local bus L0T have a high level, the transistor TR05 is turned on. Therefore, the read global bus G1 is given a low level.

On the contrary, it is assumed that the data transmitted to the local bus L0T have a low level. In this event, the transistor TR05 is turned off so that the read global bus G1 holds a high level clamped by the transistor TRC.

Thus, since the local bus L0T is connected to the read global bus G1 through the transistor TR05, the local bus and the read global bus G1 are inverted in data logic.

Specifically, when the data on the local bus L0T has a high level, the data on the read global bus G1 has a low level. When the data on the local bus L0T has a low level, the data on the read global bus G1 has a high level.

Now, a writing operation will be described.

Each of the word lines WL01 through WL0n has a signal level of a high level. The signal WSW0 is given a high level to turn on the transistor TR07 so that write data on the write global bus G2 are transmitted to the local bus L0T. At this time, the write global bus G2 and the local bus L1T are not inverted in data logic.

The signal YSW0 is given a high level and the write data on the local buses L0T and L0N are transmitted to the digit lines D0 and DB0. Since the word lines WL00 through WL0n have a high level, the digit lines D0 and DB0 and the cells C00 through C0n are connected. Therefore, the write data on the digit lines D0 and DB0 are written in the cells C00 through C0n.

As described above, the signal from the local bus is supplied to the gate of the transistor and the local bus and the global bus are connected at the junction between the local bus and the global bus. Thus, according to this invention, the capacitance of the global bus does not act as the load upon the sense amplifier so that the sensing time can be shortened.

What is claimed is:

1. A semiconductor memory device comprising a plurality of banks, a plurality of local buses arranged in said banks, and a global bus connected to said local buses, and a switching element arranged at a junction between each of said local buses and said global bus, wherein:

said switching element comprises a transistor;

said transistor being responsive to a signal supplied from said local bus to its gate, said transistor connecting said local bus and said global bus.

2. A semiconductor memory device as claimed in claim 1, wherein said global bus is provided with a clamp element for holding said global bus at a high level.

3. A semiconductor memory device as claimed in claim 2, wherein said local bus is provided with a second clamp element for holding said local bus at a high level.

4. A semiconductor memory device as claimed in claim 1, wherein said local bus is provided with a clamp element for holding said local bus at a high level.

5. A semiconductor memory device as claimed in claim 1, wherein said global bus is divided into a read global bus and a write global bus.

6. A semiconductor memory device as claimed in claim 5, wherein said read global bus is provided with a clamp element for holding said read global bus at a high level.

7. A semiconductor memory device as claimed in claim 5, wherein said write global bus is provided with a second switching element for transmitting write data on said write global bus to said local bus upon writing.

* * * * *